(12) United States Patent
Boerstler et al.

(10) Patent No.: US 6,229,358 B1
(45) Date of Patent: May 8, 2001

(54) DELAYED MATCHING SIGNAL GENERATOR AND FREQUENCY MULTIPLIER USING SCALED DELAY NETWORKS

(75) Inventors: David William Boerstler, Round Rock, TX (US); Joel Abraham Silberman, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/461,973

(22) Filed: Dec. 15, 1999

(51) Int. Cl.$^7$ ...................................................... H03B 19/00
(52) U.S. Cl. ......................... 327/116; 327/122; 327/121; 327/271; 327/277; 327/284
(58) Field of Search ................................... 327/116, 119, 327/120, 121, 122, 271, 277, 284

(56) References Cited

U.S. PATENT DOCUMENTS 5,963,071 * 10/1999 Dowlatabadi ........................ 327/175

* cited by examiner

*Primary Examiner*—Toan Tran
*Assistant Examiner*—Cassandra Cox

(74) *Attorney, Agent, or Firm*—Casimer K. Salys; Felsman, Bradley, Vaden, Gunter & Dillon, LLP

(57) ABSTRACT

A delayed matching signal generator and frequency multiplier using scaled delay networks for providing precisely delayed matching signals and multiplied frequency signals is provided. The system and method of phase shifting a periodic input digital signal comprises a reference delay line, a replica delay line, and a matched characteristics control system. The reference delay line is composed of multiple reference delay stages through which the input signal is propagated, and the replica delay line is composed of replica delay stages scaled in proportion to the multiple reference delay stages by a scaled delay factor wherein the input signal is propagated. The matched characteristics control system is coupled to the reference delay line and the replica delay line for extracting a phase shifted signal from the replica delay line based upon the scaled delay factor and a scaled propagation of the input signal through the reference delay line. The matched characteristics control system further comprises a capture and detect system for detecting transitions of the input signal and through which the input signal is propagated and a selector for halting propagation and capturing the input signal equivalent to the on-time period. A frequency multiplier converter is coupled to the replica delay line for logically combining the input signal with the phase shifted signal to generate an output signal that has a frequency that is a frequency multiplication factor of the reference frequency of the input signal IN.

22 Claims, 12 Drawing Sheets

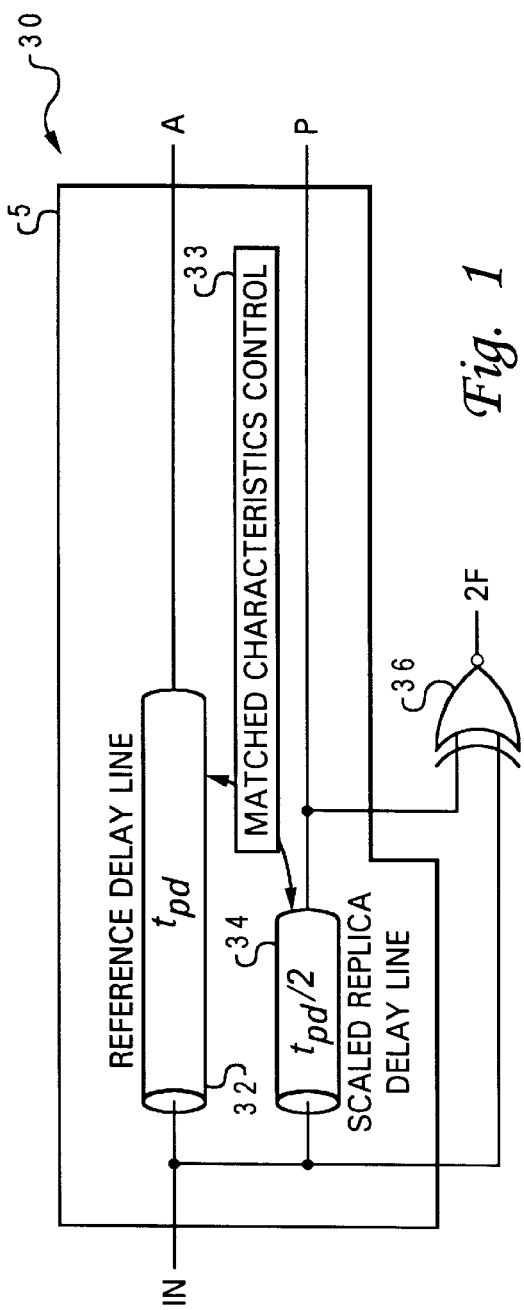
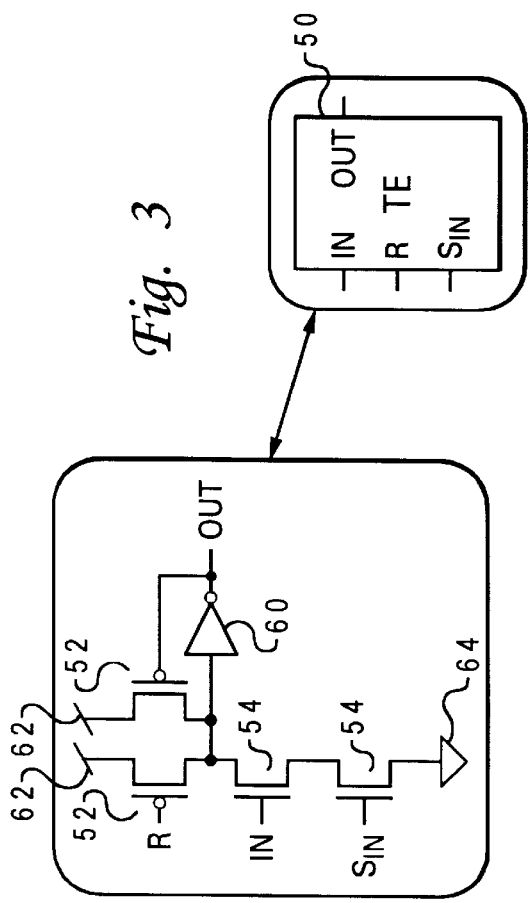
Fig. 1
Fig. 3

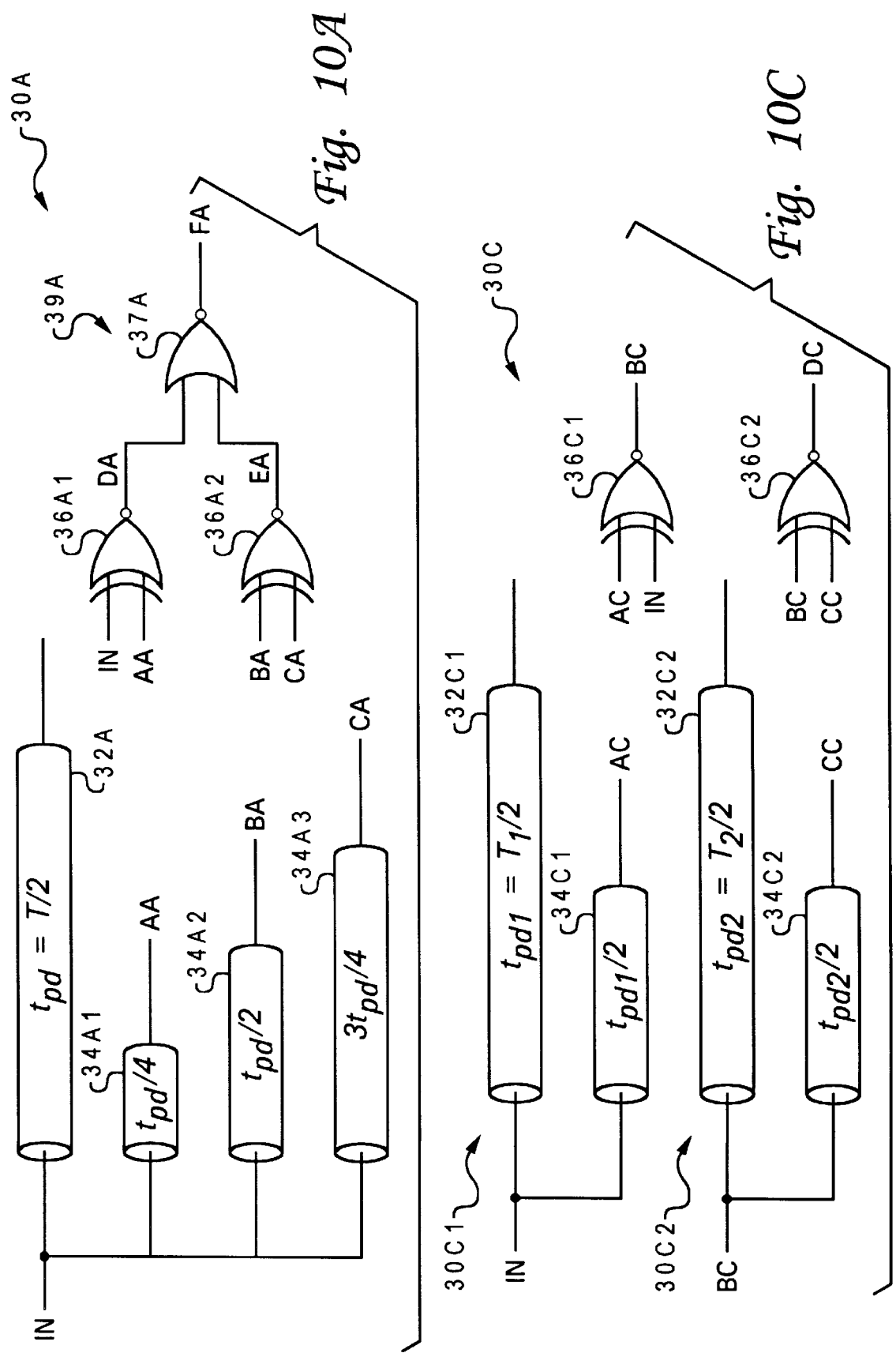

DELAYED MATCHING SIGNAL GENERATOR AND FREQUENCY MULTIPLIER USING SCALED DELAY NETWORKS

BACKGROUND OF THE INVENTION

1. Technical Field

The present invention relates in general to a clock pulse generator and frequency multiplier and in particular to a delayed matching signal generator and frequency multiplier that is provided by using scaled delay networks for providing precisely delayed matching signals and multiplied frequency signals.

2. Description of the Related Art

It is well known and desirable at times to generate a higher frequency clock from a lower frequency clock. For example, such a higher frequency clock is required for synchronization between two chips that need to communicate with each other. Phase Locked Loop (PLL) based clock frequency multipliers are commonly used in microprocessors for generating the main processor clock from a lower frequency clock. It is generally known that a PLL takes the bus clock and multiplies it to a higher frequency. One problem is that the extreme performance requirements for these frequency multipliers generally warrant the use of complex PLLs since frequency synthesis PLLs (analog circuits) are typically difficult to design. A digital solution is generally desired since it is typically easier to design and migrates between technologies more easily. However, less critical timing applications, such as bus synchronization (communications between two chips), special clock recovery, and data re-timing systems, do not warrant such extreme performance requirements, and lower accuracy and reduced cost/design frequency multipliers may be able to be designed and used.

Delay Locked Loop (DLL) approaches are popular for some of these applications, but such techniques have drawbacks and limitations, such as having to maintain a relatively short delay due to possible increases in power supply sensitivity, requirements of special initialization protocol, longer acquisition time, and inability to provide frequency multiplication.

There exist dynamic circuits or devices which require the generation of a reset signal. For example, the reset signal is able to be used for resetting a signal capture and latch process or other such processes. Conventional and prior art approaches involve delay techniques which produce reset pulse widths that are independent of clock frequency but which are also highly dependent on process, temperature, and supply voltage. The operating frequency of these circuits or devices using conventional reset generation is limited since the reset portion of the period may become too large compared to the evaluation portion as the period time is reduced. In examining a cycle of a clock period, the evaluation period and the reset period must be compared. The reset must be set for a minimal period of time, such as a set percentage (i.e. 10%) of the cycle. If the frequency is increased, the reset portion of the clock cycle may become a larger percentage of the cycle.

Also, it is well known in the art to generate a reset signal for a clock signal by simply using and delaying the clock signal by a delay value. However, if the frequency of the clock signal increases (i.e. period decreases) and the delay of the clock signal for generating the reset signal is not adjusted in any way, then the reset signal portion of the period may become too large compared to the evaluation period. Conversely, if the frequency of the clock signal decreases (i.e. period increases) and the delay of the clock signal for generating the reset signal is not adjusted in any way, then the reset signal portion of the clock period may become too small, and the reset signal may extend over into the next period or cycle of the clock signal. Thus, matching the delay of the clock signal for generating the reset signal in proportion to the period or frequency of the clock signal is highly advantageous and desirable.

It is therefore advantageous and desirable to provide a delayed matching signal generator for generating a delayed matching signal from an input signal wherein the delayed matching signal generator uses, matches, and more precisely controls a delay of the input signal in proportion to the period or frequency of the input signal in generating the delayed matched signal. It is also advantageous and desirable to provide a reset signal generator for generating a reset signal from a clock input signal wherein the reset signal generator uses, matches, and more precisely controls a delay of the clock input signal in proportion to the period or frequency of the input signal in generating the reset signal. It would be further advantageous and desirable to use the delayed matching signal generator for using, matching, and more precisely controlling a delay of a signal for generating more precisely delayed matched signal(s) wherein the signal and the delayed matched signal(s) may be used to generate a multiplied frequency signal. It is also advantageous and desirable to provide improved and better systems and methods of generating a higher frequency clock from a lower frequency clock. It is still also advantageous and desirable to provide relatively simple and inexpensive systems and methods for generating such higher frequency clock from a lower frequency clock.

SUMMARY OF THE INVENTION

It is therefore one object of the present invention to provide a delayed matching signal generator for generating a delayed matching signal from an input signal wherein the delayed matching signal generator uses, matches, and more precisely controls a delay of the input signal in proportion to the period or frequency of the input signal in generating the delayed matched signal.

It is also another object of the present invention to provide a reset signal generator for generating a reset signal from a clock input signal wherein the reset signal generator uses, matches, and more precisely controls a delay of the clock input signal in proportion to the period or frequency of the clock input signal in generating the reset signal.

It is a further object of the present invention to use the delayed matching signal generator for using, matching, and more precisely controlling a delay of a signal for generating more precisely delayed matched signal(s) wherein the signal and the delayed matched signal(s) may be used to generate a multiplied frequency signal.

It is a further object of the present invention to provide improved and better systems and methods of generating a higher frequency clock from a lower frequency clock.

It is still a further object of the present invention to provide relatively simple and inexpensive systems and methods for generating such higher frequency clock from a lower frequency clock.

The foregoing objects are achieved as is now described. A delayed matching signal generator and frequency multiplier using scaled delay networks for providing precisely delayed matching signals and multiplied frequency signals is provided. The system and method of phase shifting a periodic input digital signal comprises a reference delay line, a replica delay line, and a matched characteristics control system. The reference delay line is composed of multiple reference delay stages through which the input signal is propagated, and the replica delay line is composed of replica delay stages scaled in proportion to the multiple reference delay stages by a scaled delay factor wherein the input signal is propagated. The matched characteristics control system is coupled to the reference delay line and the replica delay line for extracting a phase shifted signal from the replica delay line based upon the scaled delay factor and a scaled propagation of the input signal through the reference delay line. The matched characteristics control system further comprises a capture and detect system for detecting transitions of the input signal and through which the input signal is propagated and a selector for halting propagation and capturing the input signal equivalent to the on-time period. A frequency multiplier converter is coupled to the replica delay line for logically combining the input signal with the phase shifted signal to generate an output signal that has a frequency that is a frequency multiplication factor of the reference frequency of the input signal IN.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 1 is an overall example topology diagram showing the present invention delayed matching signal generator and frequency multiplier using scaled delay networks;

FIG. 3 are diagrams illustrating a thermometer element for the thermometer register that is used in the delayed matching signal generator and frequency multiplier of FIG. 2;

FIG. 10A is another example topology diagram showing a parallel coupling approach for providing the present invention delayed matching signal generator and frequency multiplier using scaled delay networks wherein the generator and multiplier provides a frequency multiplication factor of four;

FIG. 10C is a further example topology diagram showing a serial approach of the present invention delayed matching generator and frequency multiplier using scaled delay networks wherein the generator and multiplier provides a frequency multiplication factor of four;

DETAILED DESCRIPTION OF ILLUSTRATIVE EMBODIMENT

Figure 2:
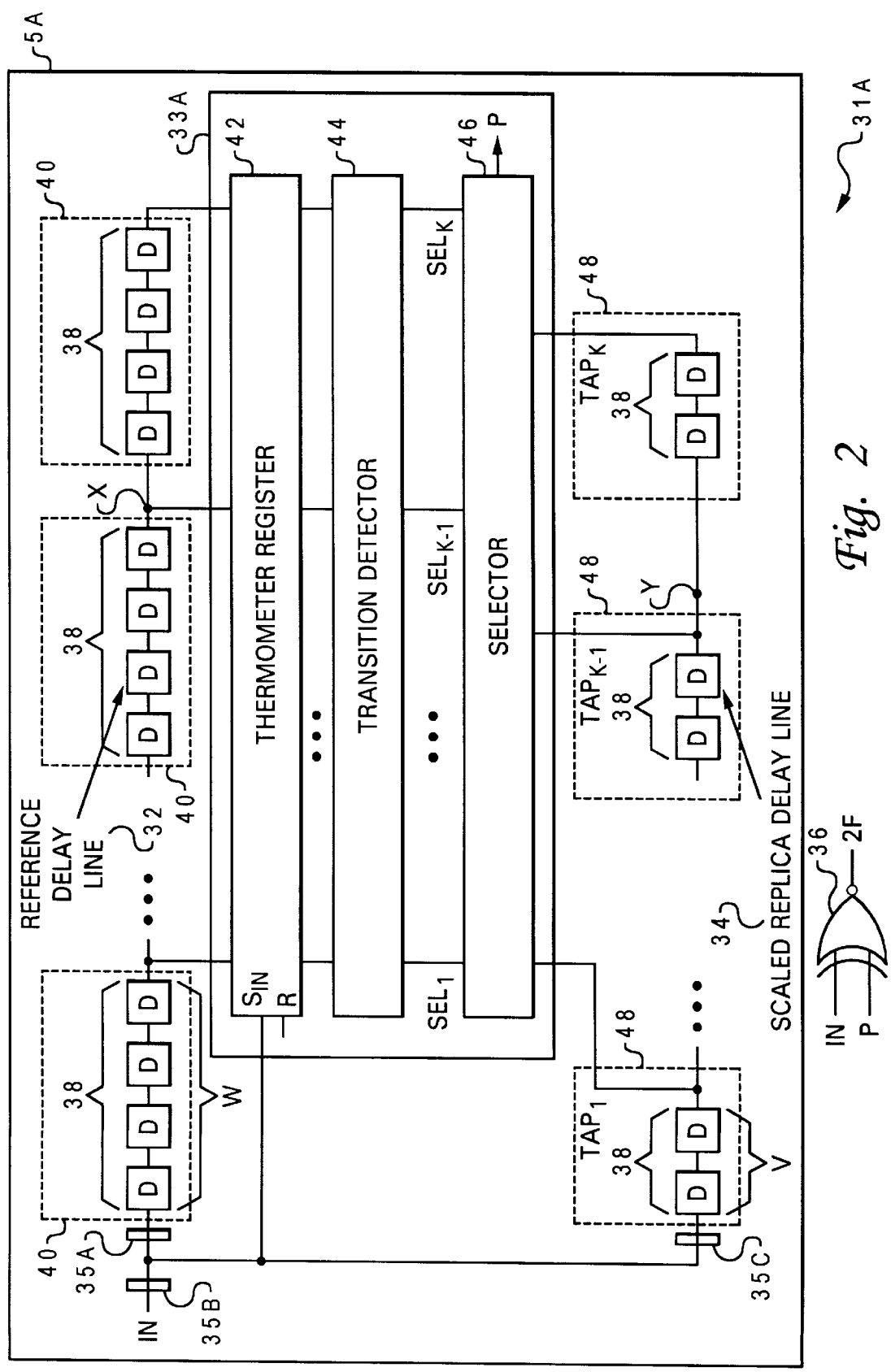
FIG. 2 is a more detailed example block diagram of the present invention delayed matching signal generator and frequency multiplier of FIG. 1.

The present invention provides a delayed matching signal generator and frequency multiplier using scaled delay networks for providing precisely delayed matching signals and multiplied frequency signals. The present invention provides a delayed matching signal generator for generating a delayed matching signal from an input signal. The delayed matching signal generator uses, matches, and more precisely controls a delay of the input signal in proportion to the period or frequency of the input signal in generating the delayed matched signal. In particular, the present invention provides a reset signal generator for generating a reset signal from a clock input signal wherein the reset signal is able to be used for resetting a signal capture and latch process or other such processes. The reset signal generator uses, matches, and more precisely controls a delay of the clock input signal in proportion to the period or frequency of the clock input signal in generating the reset signal. The present invention further uses the delayed matching signal generator for using, matching, and more precisely controlling a delay of a signal wherein more precisely delayed matched signal(s) is/are generated therefrom. The signal and the delayed matched signal(s) is/are used to generate a multiplied frequency signal.

With reference now to the figures and in particular with reference to FIG. 1, the overall example topology diagram 30 shows the present invention delayed matching signal generator and frequency multiplier using scaled delay networks. The diagram 30 comprises a delayed matching signal generator 5 and a frequency multiplier circuit 36. The delayed matching signal generator 5 is able to generate a delayed signal P that is a matching signal to the input clock signal IN and is precisely controlled and delayed by a scaled delay value. The delay value of the input signal IN is precisely controlled to be in proportion to the period or frequency of the input signal IN. The delay value is used to construct a pulse signal, which is used as a reset signal that maintains a constant proportion of the clock cycle.

The example diagram 30 in FIG. 1 shows that the delayed matching signal generator 5 comprises a reference delay line 32 having a propagation delay time $t_{pd}$ and a scaled replica delay line 34 having a propagation delay time $t_{pd}/2$ (i.e. half of the reference propagation delay $t_{pd}$ as an example). A matched characteristics control system 33 is coupled to the reference delay line 32 and the scaled replica delay line 34. The matched characteristics control system 33 captures an on-time period of the input signal IN. When the on-time period of the input signal IN is captured, a respective delay stage or group or tap 40 at some point X in the reference delay line 32 (i.e. see FIGS. 2 or 6) is selected based on the corresponding length of the captured on-time period of the input signal IN. The position or point X reflects the place of transition from a high signal to a low signal of the input signal IN for generating a reference delay signal A that is the input signal IN delayed by the propagation delay time $t_{pd}$ (i.e. on-time period of the input signal IN), and the position or point X is held or captured when the high to low transition of the input signal IN occurs. The reference delay signal A propagating through the reference delay line 32 becomes the input signal IN delayed by the on-time period of the input signal IN (i.e. the propagation delay time $t_{pd}$ is equal to the on-time of the input signal IN) based on the delay stage or group or tap 40 selected. When the respective delay stage or group or tap 40 at some point X in the reference delay line 32 (i.e. see FIGS. 2 or 6) is selected, then a respective delay stage or group or tap 48 at a corresponding point Y in the scaled replica delay line 34 is also selected. This corresponding point Y reflects the place of transition from a high signal to a low signal of the input signal IN (i.e. trail of the on-time period of the input signal IN) for generating a scaled replica delay signal P that is the input signal IN delayed by a scaled propagation delay factor times the propagation delay time $t_{pd}$. The position or point Y is also held when the high to low transition of the input signal IN occurs.

Figure 6:
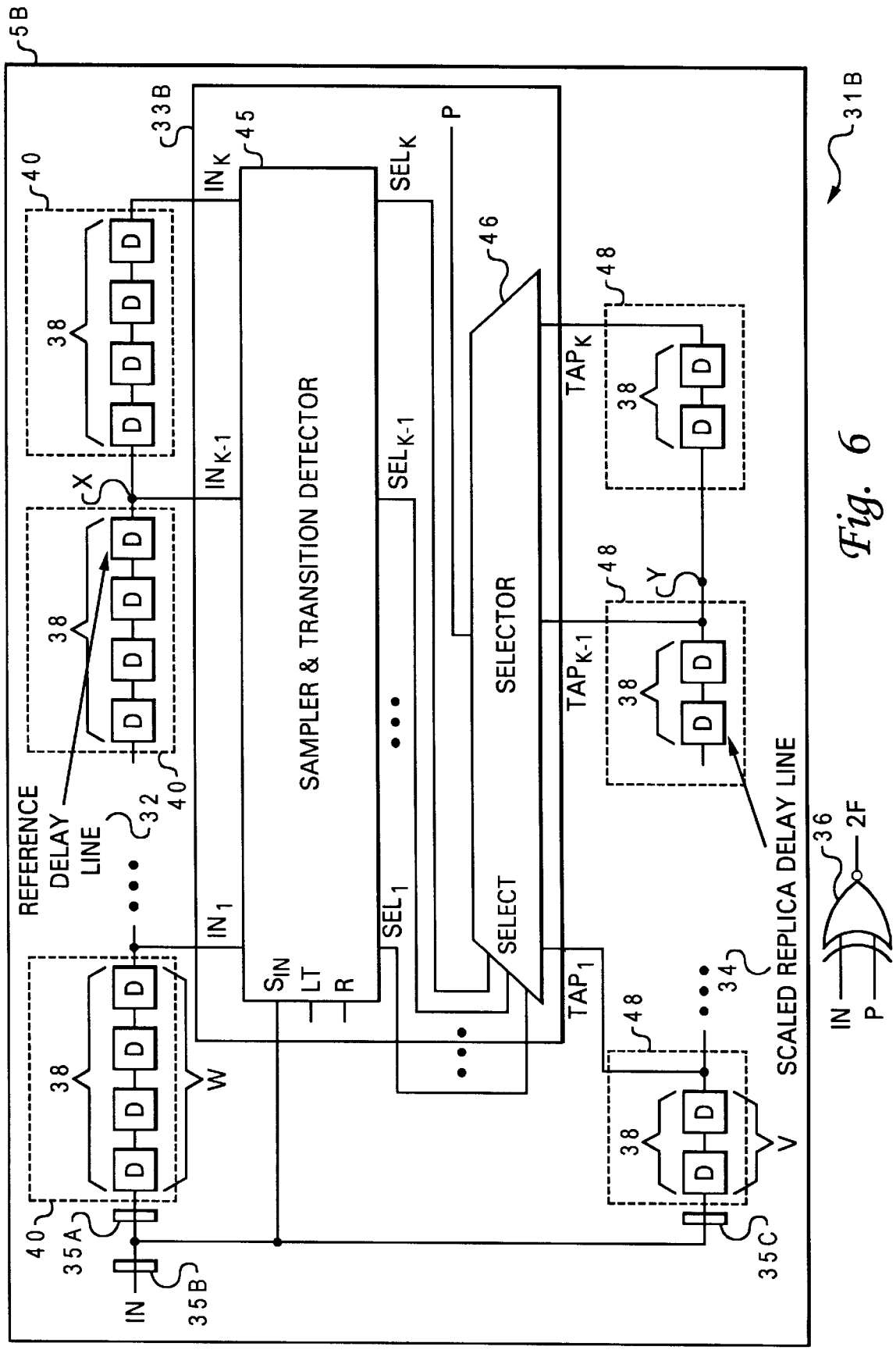
FIG. 6 is another more detailed example block diagram of the present invention delayed matching signal generator and frequency multiplier using scaled delay networks.

The scaled propagation delay factor is determined by the ratio of the delay frequency in the scaled replica delay line 34 to the delay frequency in the reference delay line 32 (i.e. V delay elements 38 per delay stage or group or tap 48 in the scaled replica delay line 34 to the W delay elements 38 per delay stage or group or tap 40 in the reference delay line 32). Thus, the scaled propagation delay factor is V/W. In FIGS. 1, 2, and 6, the scaled propagation delay factor is set to one half (½) since V equals two elements 38 per tap 48 and W equals four (4) elements 38 per tap 40. Thus, the present invention is not in any way limited to any particular or specific scaled propagation delay factor, and any suitable scaled propagation delay factor is able to be used in conjunction with the present invention to scale the propagation delay time $t_{pd}$ to a desired amount. The scaled and delayed matching signal P is then able to be used with the input signal IN and any other generated delayed matching signal (s) to generate a multiplied frequency signal that has a frequency equal to the reference frequency of the input signal IN multiplied by a factor N.

With reference to FIGS. 2 to 5, an implementation of the present invention delayed matching signal generator and frequency multiplier 31A is shown. The generator/multiplier 31A provides a two times frequency multiplier since the frequency multiplier factor N has been set equal to two in this example. FIG. 2 is a detailed block diagram of the present invention delayed matching signal generator and frequency multiplier 31A, which is one example implementation of the generator/multiplier 30 of FIG. 1. The delayed matching signal generator 5A, which is an example implementation of the generator 5 in FIG. 1, comprises the reference delay line 32, the matched characteristics control system 33A, which is an example implementation of the control system 33 in FIG. 1, and the scaled replica delay line 34. The matched characteristics control system 33A comprises a thermometer register 42, a transition detector 44, and a selector 46.

In FIG. 2, delay elements D 38 (as an example, delay elements D 38 may be a number of inverters) are coupled in series with multiple periodic delay stages or groups or taps 40 to form the reference delay line 32. The generator/multiplier 31A shows that there are stages or groups or taps 40 wherein each stage or group or tap 40 comprises four delay elements D 38 for the reference delay line 32. The second delay line 34 is formed using the same delay elements D 38 and with periodic stages or groups or taps 48 wherein each stage or group or tap 48 comprises a smaller number of delay elements D 38, two delay elements D 38. The second delay line 34 provides the precisely scaled delay factor of one half (i.e. V=2 and W=4) to provide the scaled delay output signal P. The exclusive OR gate or differentiator 36 is again shown in FIG. 2 wherein the exclusive OR gate or differentiator 36 receives the input signal IN and the precisely scaled delay output signal P, and it creates a signal that has twice the frequency (i.e. frequency 2F) as the input signal IN (i.e. frequency F).

As stated earlier, the sub-systems of the matched characteristics control system 33A include a thermometer register 42, a transition detector 44, and a selector 46. These subsystems will now be discussed in more detail.

Figure 4:
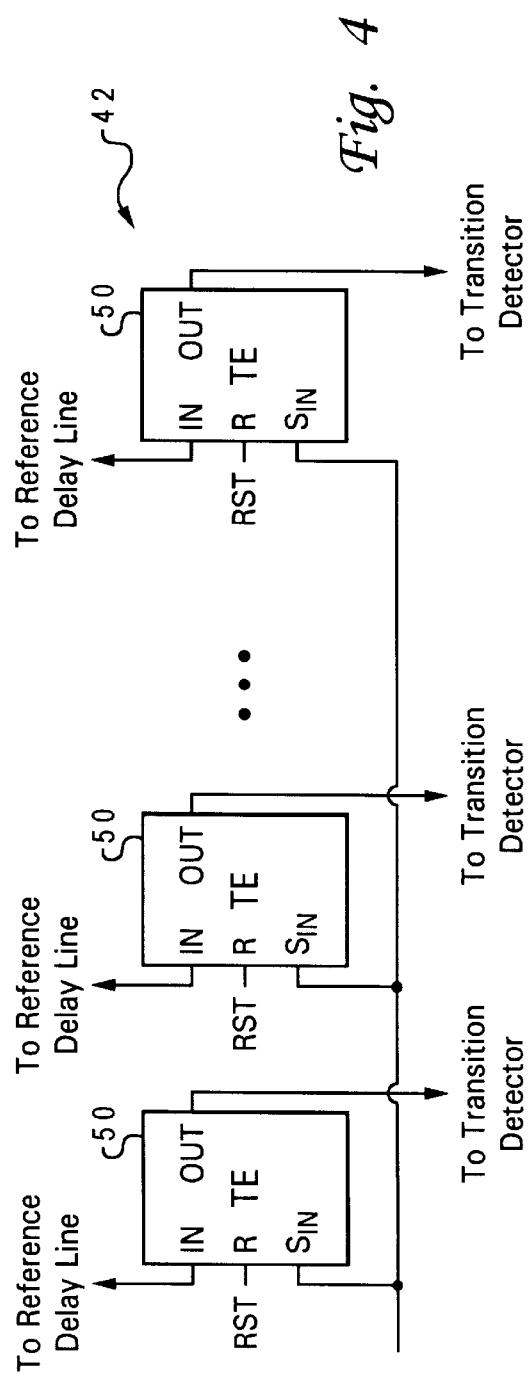
FIG. 4 is a diagram illustrating the thermometer register with various thermometer elements coupled together wherein the thermometer register is used in the delayed matching signal generator and frequency multiplier of FIG. 2.
Figure 5:
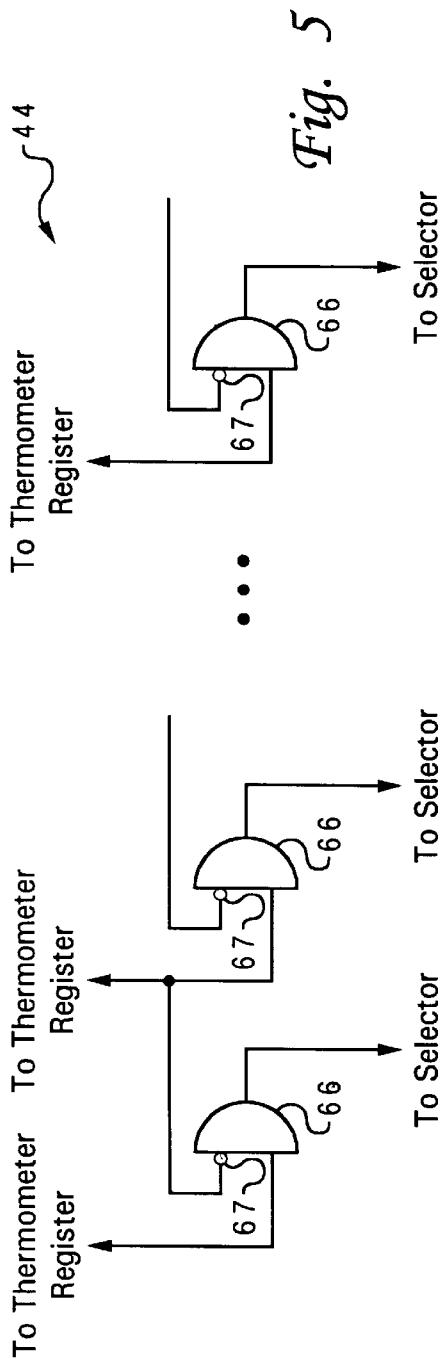
FIG. 5 is a general diagram of the transition detector that is used in the delayed matching signal generator and frequency multiplier of FIG. 2.

With reference now to the figures and in particular with reference to FIGS. 3 to 4, a thermometer element 50 and the thermometer register 42 are respectively shown in more detail. FIG. 3 shows that each thermometer element 50 comprises two PFETs 52, two NFETs 54, and an inverter 60 coupled in the manner shown in FIG. 3 and coupled to the power voltage 62 and ground 64. The thermometer element 50 has as its inputs the input signal IN, a reset signal RST to be applied to a reset pin R, and the select or strobe signal $S_{IN}$ which is the clock input signal IN acting as a strobe or select signal (i.e. selects the respective stage or delay group or tap 40 in the reference delay line 32 and the stage or group or tap 48 in the scaled replica delay line 34). The output of the thermometer element 50 is the output signal OUT. The thermometer register 42 comprises a number of thermometer elements 50 coupled together in the manner shown in FIG. 4. The thermometer register 42 allows propagation and capturing of the input signal IN through its thermometer elements 50. With reference now to the figures and in particular with reference to FIG. 5, the transition detector 44 is shown in more detail. The transition detector 44 comprises a number of AND gates 66 and inverters 67 coupled in the manner shown in FIG. 5.

The thermometer register 42 is constructed as shown in FIGS. 3 and 4, and it is enabled by the input signal IN going high. As the wavefront of the input signal IN propagates down the reference delay line 32, the initially low outputs from the thermometer register 42 progressively become asserted (i.e. from left to right in FIG. 2). Thus, a number of high signals (one values) propagate down the reference delay line 32 and a number of outputs in the thermometer register 42 become high (one value) as the input signal IN goes from low to high (from zero to one value). When the input signal IN goes low again, the contents of the thermometer register 42 are captured and latched due to the disabling of all of the inputs. In other words, the values of the input signal IN are all initially zeroes. When the input signal IN goes high, all of the inputs into the thermometer register 42 are enabled and the input signal IN as effected by the scaled replica delay line 34 propagate through the thermometer register 42. When the input signal IN goes low, all inputs of the input signal IN are disabled, and the contents of the thermometer register 42 are captured and latched.

The transition from high to low again in the thermometer register 42 results and corresponds to the tap 40 at point X (as discussed earlier for FIG. 1) in the reference delay line 32, which delays the input signal IN by the on-time (i.e. high time) of its input, which, in the example, is T/2 for a 50% duty cycle input signal having a period of T. The transition is located by the transition detector 44 shown in FIG. 5, which asserts one and only one output. The output from the transition detector 44 is sent to the selector 46 to select the corresponding tap 48 at the point Y (as discussed earlier for FIG. 1) in the scaled replica delay line 34, which delays the input signal IN by $t_{pd}/2$ (or T/4 since $t_{pd}=T/2$), which is half the delay of the reference propagation delay time $t_{pd}$ since the scaled propagation delay factor is a factor of one half as discussed earlier.

Thus, the transition of the input signal IN from high to low, which is detected by the transition detector 44, causes the stage or group or tap 40 at point X in the reference line 32 to be selected in order for the input signal IN to be delayed by T/2 (i.e. equal to $t_{pd}$). The output from the transition detector 44 selects the stage or tap or group 48 at point Y in the scaled replica delay line which delays the input signal IN by T/4 (i.e. equal to $t_{pd}/N$), thus producing the output signal P that is shifted in phase by T/4 since the scaling delay factor is one half (½) in the example.

The delayed matching or scaled delay signal P generated by generator/multiplier 31A is able to be used to construct a reset signal for a signal capture and latch process. Since the delay of the signal P is in proportion to an on-time of the input signal IN, the reset signal (i.e. reset period portion) and the evaluation period portion are able to maintain a constant proportion of the clock cycle or period T of the input signal IN.

As described in reference to FIG. 2, if an exclusive OR operation is performed by the exclusive OR gate or differentiator 36 on the signal IN and the signal P that is the signal IN shifted in phase by $t_{pd}/2$, the resulting output is a signal 2F, which is twice the frequency of the IN signal, which has a frequency of F.

With reference to FIGS. 6 to 9, an implementation of the present invention delayed matching signal generator and frequency multiplier 31B is shown. The generator/multiplier 31B provides a two times frequency multiplier since the frequency multiplier factor N has been set equal to two in this example. FIG. 6 is a detailed block diagram of the present invention delayed matching signal generator and frequency multiplier 31B, which is another example implementation of the generator/multiplier 30 of FIG. 1. The delayed matching signal generator 5B, which is an example implementation of the generator 5 in FIG. 1, comprises the reference delay line 32, the matched characteristics control system 33B, which is an example implementation of the control system 33 in FIG. 1, and the scaled replica delay line 34. The matched characteristics control system 33B comprises a sampler and transition detector 45 and a selector 46.

In FIG. 6, delay elements D 38 (as an example, delay elements D 38 may be a number of inverters) are coupled in series with multiple periodic delay stages or groups or taps 40 to form the reference delay line 32. The generator/multiplier 31B shows that there are stages or groups or taps 40 wherein each stage or group or tap 40 comprises four delay elements D 38 for the reference delay line 32. The second delay line 34 is formed using the same delay elements D 38 and with periodic stages or groups or taps 48 wherein each stage or group or tap 48 comprises a smaller number of delay elements D 38, two delay elements D 38. The second delay line 34 provides the precisely scaled delay factor of one half (i.e. V=2 and W=4) to provide the scaled delay output signal P. The exclusive OR gate or differentiator 36 is again shown in FIG. 6 wherein the exclusive OR gate or differentiator 36 receives the input signal IN and the precisely scaled delay output signal P, and it creates a signal that has twice the frequency (i.e. frequency 2F) as the input signal IN (i.e. frequency F).

As stated earlier, the sub-systems of the matched characteristics control system 33B include a sampler and detector 45 and a selector 46. These sub-systems will now be discussed in more detail.

Figure 7:
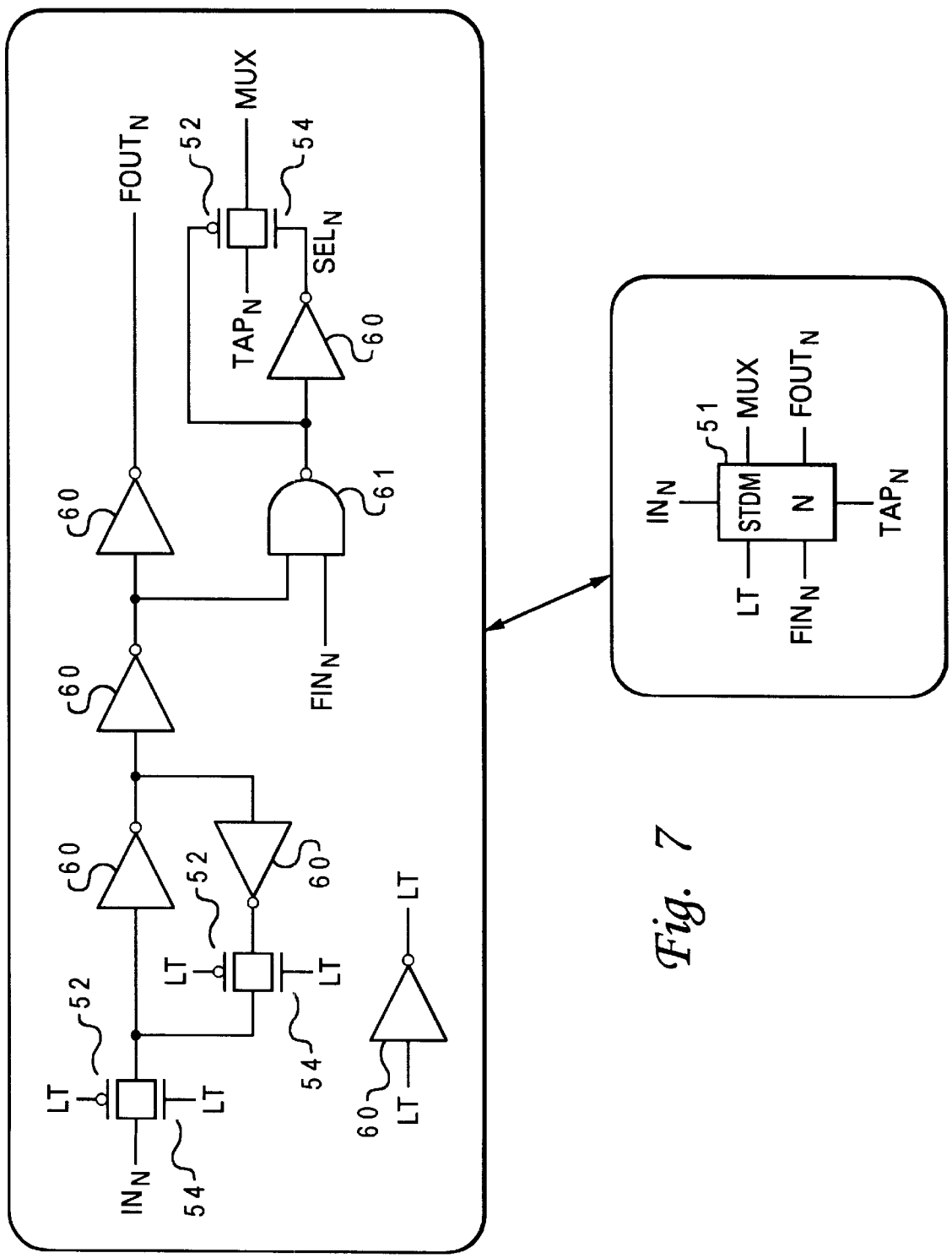
FIG. 7 are diagrams illustrating one of the multiplexers for the sampler and transition detector that is used in the delayed matching signal generator and frequency multiplier of FIG. 6.
Figure 8:
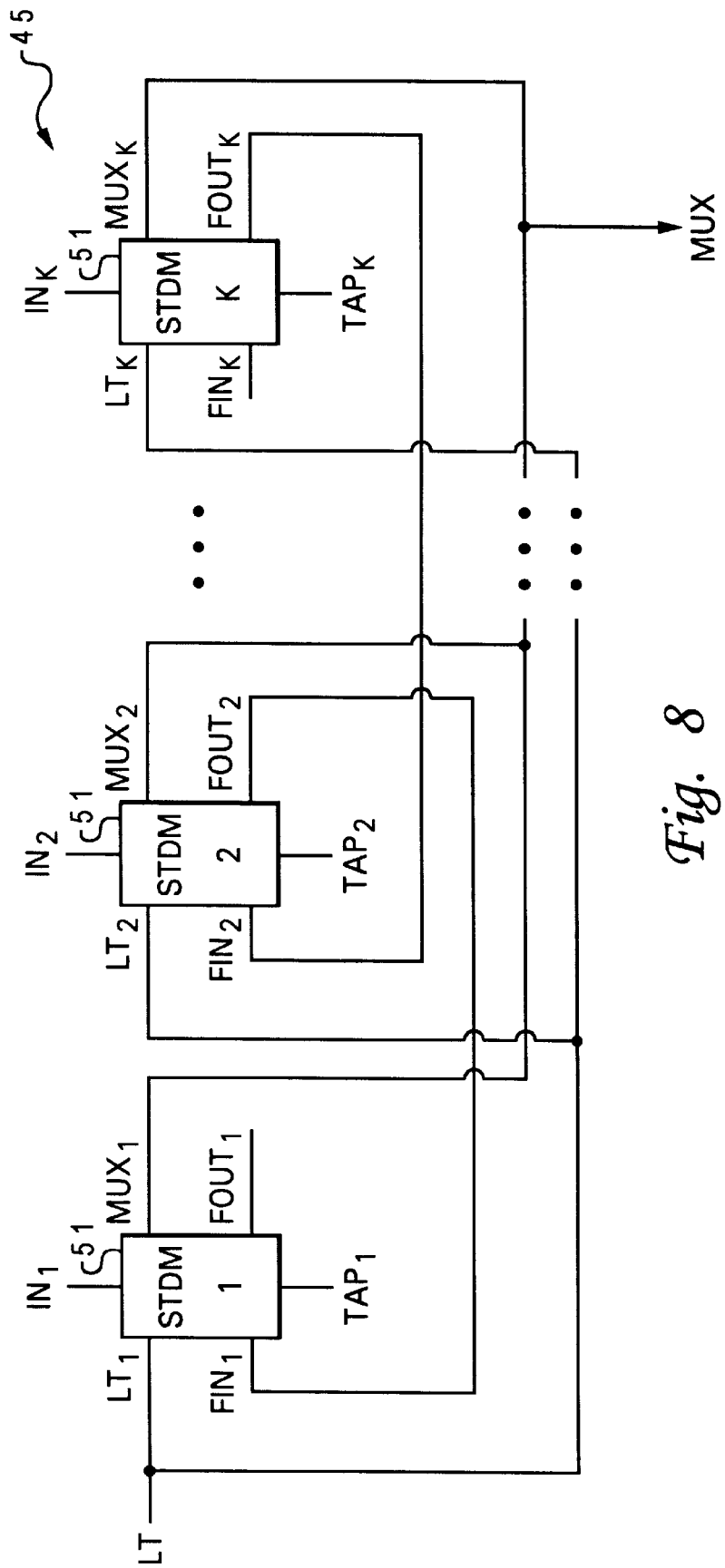
FIG. 8 is a diagram illustrating the sampler and transition detector that is used in the delayed matching signal generator and frequency multiplier of FIG. 6 wherein the sampler and transition detector comprises various multiplexers of FIG. 7 coupled together.

The sampler and transition detector 45 of the generator/multiplier 31B performs the same operations as the thermometer register 42 and the transition detector 44 of the generator/multiplier 31A. With reference now to the figures and in particular with reference to FIGS. 7 to 8, a sampler and transition detector multiplexer 51 and the sampler and transition detector 45 are respectively shown in more detail. FIG. 7 shows that each multiplexer 51 comprises two PFETs 52, three NFETs 54, and six inverters 60, and one NAND gate 61 coupled in the manner shown in FIG. 7. The multiplexer 51 has as inputs signals $IN_N$ with frequency inputs ($FIN_N$), LT signal (derived from a state machine), MUX signals (from another cascaded multiplexer), $TAP_N$ signal (tap signal), and output signal $FOUT_N$ (frequency output). The sampler and transition detector 45 comprise the multiplexers 51 coupled in the manner shown in FIG. 8. The sampler and transition detector 45 of the generator/multiplier 31B perform the same or similar operations as the thermometer register 42 and transition detector 44 of the generator/multiplier 31A, such as detecting the high to low transition of the input signal IN, selecting the stage or group or tap 40, selecting the stage or group or tap 48, providing the respective propagation delay times, providing the corresponding delayed or phase shifted signal, etc. However, the generator/multiplier 31B eliminates the propagation delay between a thermometer register 42 and a transition detector 44. The LT signal is a created signal from a state machine for latching the appropriate signal from the reference delay line 32 (i.e. latches on input and captures it). The multiplexers 51 provide control circuits for resetting and holding the state during updating of the reference delay line 32. Thus, the generator/multiplier 31B operates in the same general manner as the generator/multiplier 30A (i.e. sampler and transition detector 45 holds the tap position or point Y on the replica line 34) except that the generator/multiplier 31B provides a sampling interval centered around the negative transition on the input signal IN. The generator/multiplier 31B is generally able to provide higher frequencies than the generator/multiplier 31A. The sampler and transition detector 45 create two delay lines 32 and 34 that differ by a scaling delayed factor of V/W as stated earlier.

The delayed matching or scaled delay signal P generated by generator/multiplier 31B is able to be used to construct a reset signal for a signal capture and latch process. Since the delay of the signal P is in proportion to an on-time of the input signal IN, the reset signal (i.e. reset period portion) and the evaluation period portion are able to maintain a constant proportion of the clock cycle or period T of the input signal IN.

Figure 9:
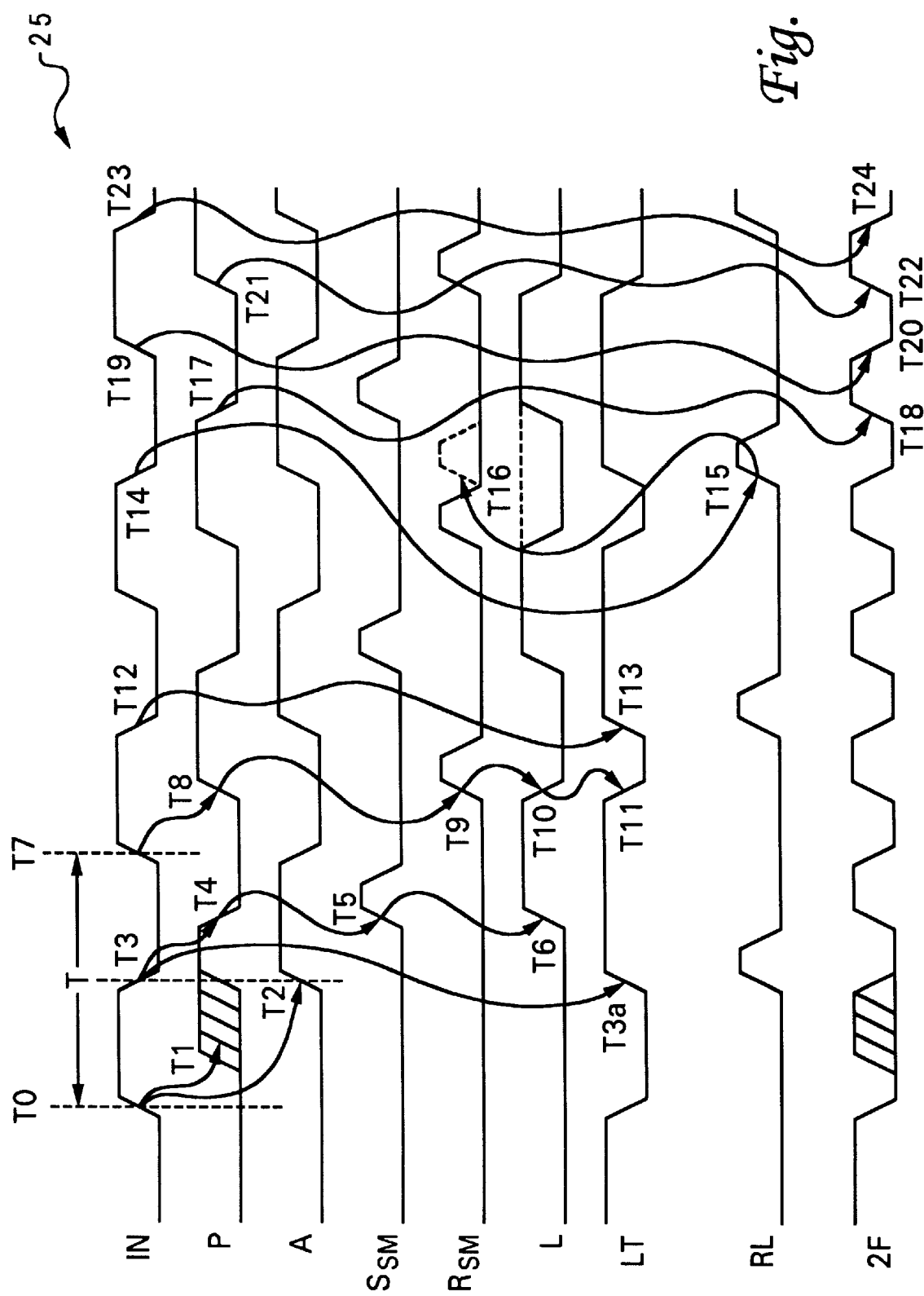
FIG. 9 is an example timing diagram for the delayed matching signal generator and frequency multiplier of FIG. 6.

With reference now to the figures and in particular with reference to FIG. 9, a timing diagram 25 for the generator/ multiplier 31B of FIG. 6 is shown. Signals $R_{SM}$ and $S_{SM}$ are provided from an RS flip flop in the state machine that generates the input signal IN (i.e. generated before the input signal IN). The signals L, LT, and RL are also created from the state machine. The internal nodes for the signals $S_{SM}$, $R_{SM}$, L, LT, and RL are used to allow sampling on the first cycle and correct for faults (i.e. L inserts high force corrections at times 14, 15, and 16 in FIG. 9). LT controls the sampling function (sample LT=low initially). In other words, the signals $S_{SM}$, $R_{SM}$, L, LT, and RL are provided to allow sampling for the first cycle (i.e. initialization) and correction for faults.

Referring to FIG. 9 (and also FIG. 6), the first rising transition on signal P (i.e. times T0 to T1) is undefined due to latch transparency (LT=low) during this period. At time T3a, the signal LT goes high from time T3 (LT=–IN or L) freezing or capturing the selected stage or tap or group 48 (i.e. at point Y) on the replica line 34. At time T4, a negative transition on signal P occurs which is the negative transition on the input delayed by T/4. This edge placement of the signal P is relative to the period T of the input signal IN and not simply a constant delay. At the edge of time T4, a one-shot pulse of the signal $S_{SM}$ is started at time T5, which sets the signal L high at time T6. The signal L being high prevents update of the sampling function (via signal LT) when the input signal IN goes high again at time T7. The input signal IN transition at time T7 is delayed by the amount T/4 (determined at time T3a) on signal P at time T8. At time T8, a one-shot pulse of the signal $R_{SM}$ is fired to time T9 which resets the signal L at time T10. The signal LT resets at time T11 to enable sampling until time T12 forces LT high at time T13. The frequency doubling at node 2F is a result of the exclusive OR (XOR) operation 36 of the signals IN and P as discussed earlier. The process repeats itself in FIG. 9 for the various times T14 to T24.

The accuracy of the process is limited by the input duty cycle since it uses the first half-cycle to determine the appropriate delays. Using an input clock divided by two (2) or any other appropriate factor on the reference delay line 32 removes the duty cycle sensitivity. The accuracy is also affected by the granularity of the delay increments. Output duty cycle is not limited to be designed to be 50%, and any suitable duty cycle may be designed and used with the present invention. The precisely controlled delayed or phase shifted signal P is not in any way limited to any particular use and application and may be used in all suitable applications and uses that would require or use a precisely controlled delayed or phase shifted signal. The multiplied frequency signal 2F is also not in any way limited to any particular use and application and may be used in all suitable applications and uses that would require or use a multiplied frequency signal.

With reference now to the figures and in particular with reference to FIGS. 2 to 6, for cases when significant delay exists in the selector 46 and output buffer of the replica delay line 34, a compensating delay 35A is able to be inserted into the path of reference delay line 32. Delays 35B and 35C may also be respectively inserted on the inputs of both the delay lines 32 and 34 to provide similar drive conditions for the compensating delay as in the selector 46.

In the specification and FIGS. 1, 2, 3, 4, 5, 6, 7, 8, and 9, examples are provided wherein the multiplication factor N equals a factor of two (2), that is, the present invention delayed matching signal generator and frequency multiplier 30 multiplies the frequency by a factor of two or doubles the frequency. However, the present invention generator/multiplier is not in any way limited to a specific frequency multiplication factor, and many other multiplication factors may be provided or achieved using techniques similar to those disclosed in this specification. In fact, FIGS. 10A, 10B, 10C, and 10D disclose delayed matching signal generators/frequency multipliers that multiply the frequency by a factor of four, and FIGS. 10E and 10F disclose delayed matching signal generators/frequency multipliers that multiply the frequency by a generic factor of N. These generators/frequency multipliers are now discussed in more detail.

With reference now to the figures and in particular with reference to FIG. 10A, an example topology diagram showing a parallel coupling approach for providing the present invention delayed matching signal generator and frequency multiplier 30A using scaled delay networks wherein the generator and multiplier 30A provides a frequency multiplication factor of four is shown. The generator and multiplier 30A of FIG. 10A is similar to the generator and multiplier 30 of FIG. 1. In providing the additional frequency multiplication, the generator and multiplier 30A comprises three scaled replica delay lines 34A1, 34A2, and 34A3 coupled in a parallel arrangement to the reference delay line 32A and to each other as opposed to the generator and multiplier 30 which has only one scaled replica delay line 34 coupled in a parallel arrangement to the reference delay line 32. The generator/multiplier 30A receives a clock pulse input signal IN having a frequency F (or period T). The generator/multiplier 30A generates a signal AA that is the input signal IN shifted in phase by a propagation delay time $t_{pd}$ multiplied by a factor of one quarter (¼) at the first scaled replica delay line 34A1 (i.e. $t_{pd}/4$), and the generator/multiplier 30A generates a signal BA that is the input signal IN shifted in phase by a propagation delay time $t_{pd}$ multiplied by a factor of one-half (i.e. ½) at the second scaled replica delay line 34A2 (i.e. $(2* t_{pd})/4$). The generator/multiplier 30A generates a signal CA that is the input signal IN shifted in phase by a propagation delay time $t_{pd}$ multiplied by a factor of three quarters (¾) at the third scaled replica delay line 34A3 (i.e. $(3* t_{pd})/4$)

Figure 10B:
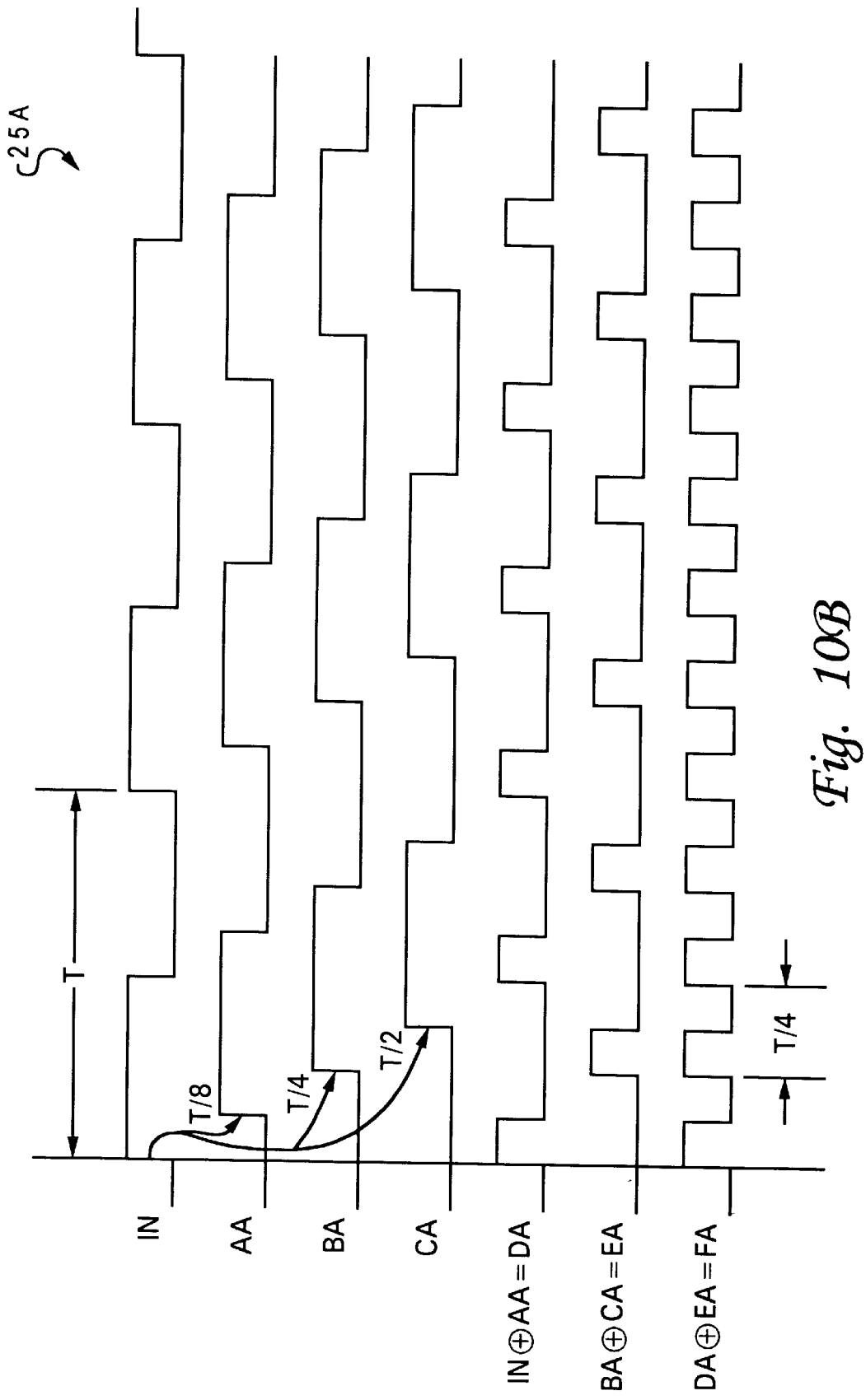
FIG. 10B is an example timing diagram for the delayed matching generator and frequency multiplier of FIG. 1A.

With reference now to the figures and in particular with reference to FIG. 10B, an example timing diagram 25A for the generator/multiplier 30A is shown. Since $t_{pd}$ equals T/2, then the signal AA is shown to basically be the IN signal shifted and delayed by T/8 time period. Furthermore, the signal BA is basically the IN signal shifted and delayed by T/4 while the signal CA is basically the IN signal shifted and delayed by T/2. A circuit 39A for converting the IN signal and the propagation delayed signals AA, BA, and CA into a multiplied frequency signal F is shown. An exclusive OR operation using an exclusive OR gate 36A1 is performed on the input signal IN and the signal AA to provide a signal DA as shown in FIG. 10B. An exclusive OR operation using an exclusive OR gate 36A2 is performed on the signal BA and the signal CA to provide a signal EA as shown in FIG. 10B. An OR operation using an OR gate 37A is performed on the signals DA and EA to provide a multiplied frequency signal FA that specifically has a frequency of four times F, which is four times the frequency of the IN signal.

With reference now to the figures and in particular with reference to FIG. 10C, an example topology diagram showing a serial coupling approach for providing the present invention delayed matching generator and frequency multiplier 30C using scaled delay networks wherein the generator and multiplier 30C provides a frequency multiplication factor of four is shown. The generator and multiplier 30C of FIG. 10C is similar to the generator and multiplier 30 of FIG. 1 in that it is the same circuit serially arranged and repeated the necessary number of times to provide the desired frequency multiplication factor (i.e. repeated 2 (=½) times to provide 4 times frequency multiplier). In providing the additional frequency multiplication, the generator and multiplier 30C of FIG. 10C comprises two serial stage circuits as opposed to the generator and multiplier 30 of FIG. 1, which has only one serial stage circuit. The stage circuit 30C1 has a reference delay line 32C1 where $t_{pd1}=T_1/2$ and a scaled replica delay line 34C1 where the scaling factor is $t_{pd1}/2$. The first stage circuit 30C1 of the generator/multiplier 30C receives a clock pulse input signal IN having a frequency F (or period T) from another clock. The first serial stage circuit 30C1 generates a signal AC that is the input signal IN shifted in phase by a propagation delay time $t_{pd1}$ multiplied by a factor of one half (½) at the first scaled replica delay line 34C1 (i.e. $t_{pd1}/2$). A conversion frequency multiplier circuit or an exclusive OR operation using an OR gate 36C1 is performed on the IN signal and the signal AC to produce a signal BC with a period of $T_2$ (=$T_1/2$). The second serial stage circuit 30C2 comprises a reference delay line 32C2 and a scaled replica delay line 34C2. The second stage circuit 30C2 receives the signal BC. The second serial stage circuit 30C2 generates a signal CC that is the signal BC shifted in phase by a propagation delay time $t_{pd2}$ multiplied by a factor of one half (½) at the second scaled replica delay line 34C2 (i.e. $t_{pd2}/2$) wherein $t_{pd2}$ equals $T_2/2$ or $T_1/4$. A conversion frequency multiplier circuit or an exclusive OR operation using an exclusive OR gate 36C2 is performed on the signal BC and the signal CC to produce a signal DC with a period of $T_3$ (=$T_2/2=T_1/4$).

Figure 10D:
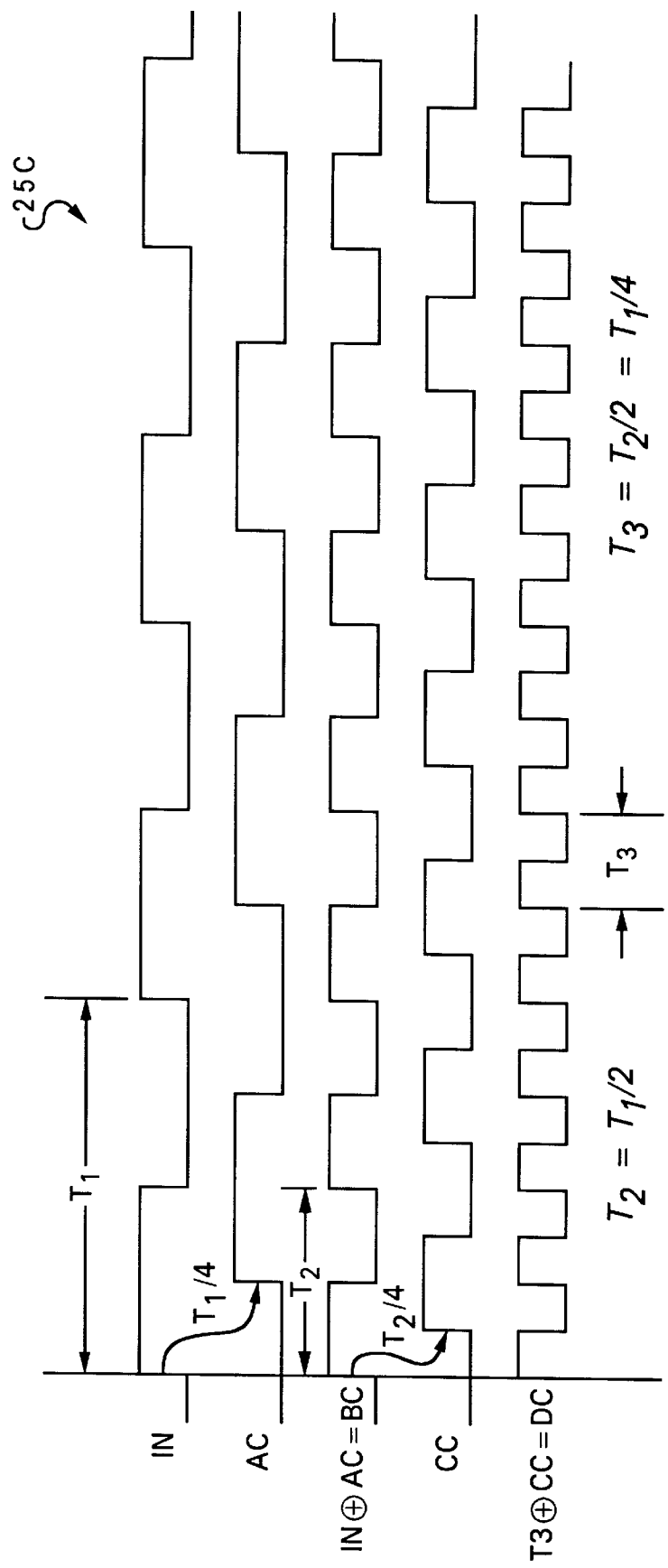
FIG. 10D is an example timing diagram for the delayed matching generator and frequency multiplier of FIG. 1C.

With reference now to the figures and in particular with reference to FIG. 10D, an example timing diagram 25C for the generator/multiplier 30C is shown. The following relationships are established for the present example: $t_{pd1}$ equals $T_1/2$, $t_{pd2}$ equals $T_2/2$, $T_2$ equals $T_1/2$, $T_3$ equals $T_2/2$ or $T_1/4$. The signal AC is shown to basically be the IN signal shifted and delayed by $t_{pd1}/2$ or $T_1/4$ time period. Furthermore, the signal BC generated from the IN signal and the signal AC has a period of $T_1/2$ or twice the frequency of the IN signal. The generated signal CC is the signal BC shifted by a propagation delay time $t_{pd2}/2$ or $T_2/4$. The signal DC generated from the signal BC and the signal CC has a period of $T_3$, which is equal to $T_2/2$ or $T_1/4$ and which is four times the frequency of the IN signal.

Figure 10E:
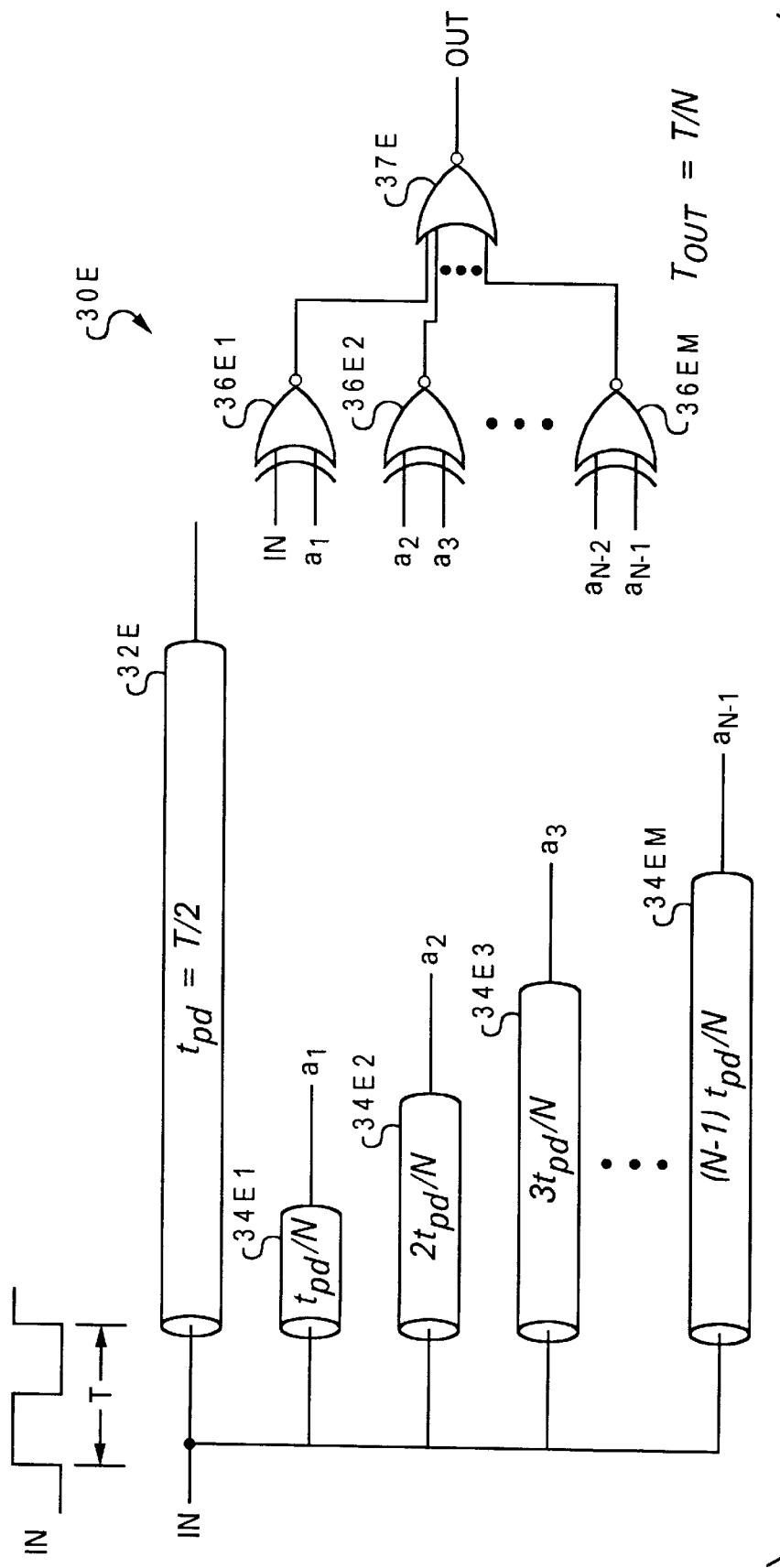
FIG. 10E is still another example topology diagram showing a parallel coupling approach for providing the present invention delayed matching generator and frequency multiplier using scaled delay networks wherein the generator and multiplier provides a frequency multiplication factor of N.

With reference now to the figures and in particular with reference to FIG. 10E, another example topology diagram showing a parallel coupling approach for providing the present invention clock pulse generator and frequency multiplier 30E using scaled delay networks wherein the generator and multiplier 30E provides a generic frequency multiplication factor of N (wherein N equals $2^k$ and k is an integer) is shown. In providing the additional frequency multiplication, the generator and multiplier 30E comprises N−1 scaled replica delay lines 34E1, 34E2, 34E3, . . . , 34EM coupled in a parallel arrangement to the reference delay line 32E and to each other. The generator and multiplier 30E receives the input signal IN. The scaled delay lines 34E1, 34E2, 34E3, . . . , 34EM produce various signals, such as $a_1, a_2, a_3, \ldots a_{N-2}, a_{N-1}$. Respective N/2 exclusive OR operations using exclusive OR gates 36E1, 36E2, . . . , 36EM are performed on these various signals. An OR operation using an OR gate 37E is performed on all of the outputs from the exclusive OR operations. The period of the output signal $T_{OUT}$ from the OR operation is T/N.

Figure 10F:
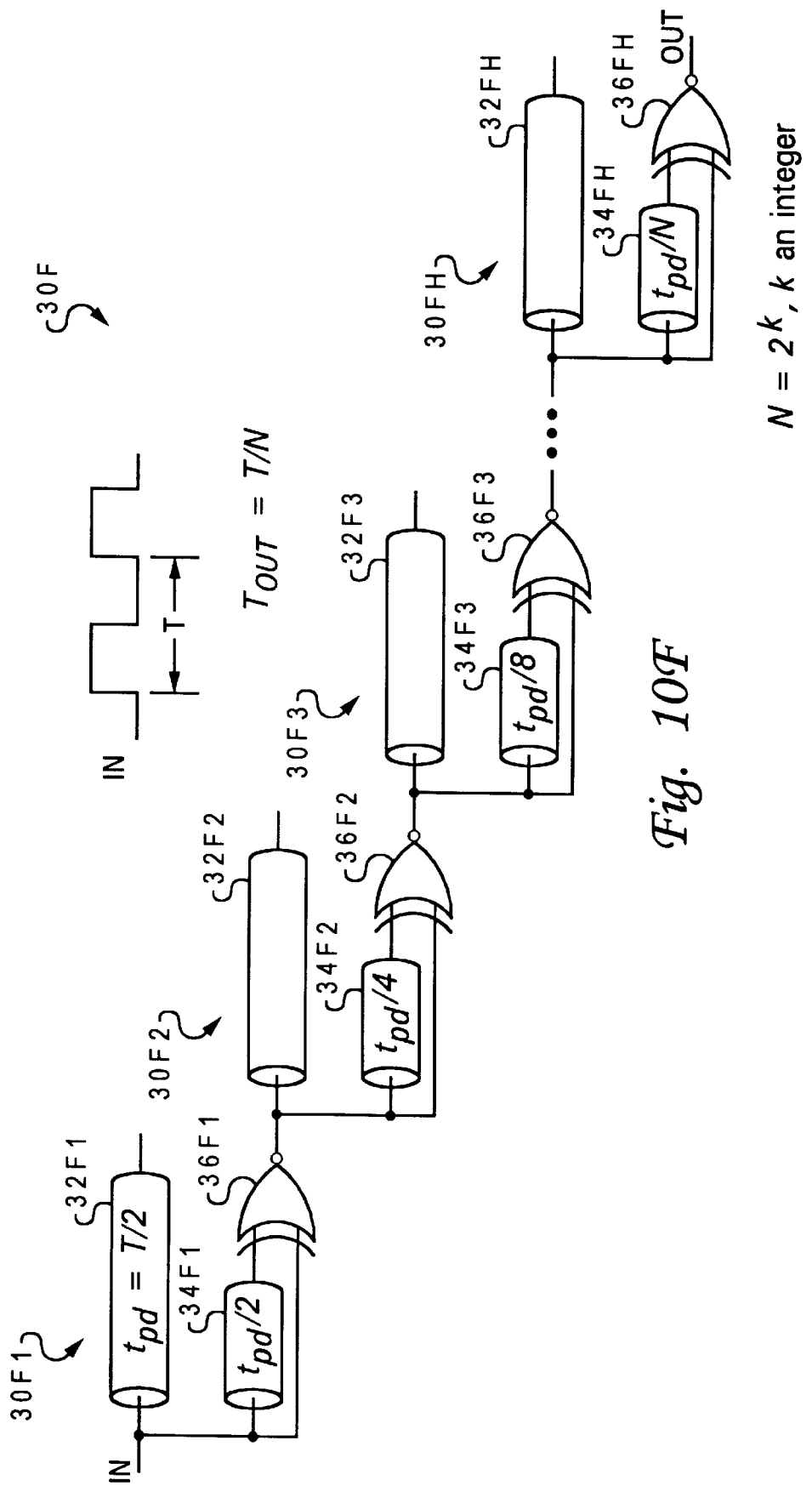
FIG. 10F is still a further example topology diagram showing a serial approach of the present invention delayed matching signal generator and frequency multiplier using scaled delay networks wherein the generator and multiplier provides a frequency multiplication factor of N.

With reference now to the figures and in particular with reference to FIG. 10F, an example topology diagram showing a serial coupling approach for providing the present invention clock pulse generator and frequency multiplier 30F using scaled delay networks wherein the generator and multiplier 30F provides a generic frequency multiplication factor of N (wherein N equals $2^k$ and k is an integer) is shown. The generator and multiplier 30F of FIG. 10F is similar to the generator and multiplier 30 of FIG. 1 in that it is the same circuit serially arranged and repeated the necessary number of times to provide the desired frequency multiplication factor N (i.e. repeated N/2 times to provide N times frequency multiplier). In providing the additional frequency multiplication, the generator and multiplier 30F of FIG. 10F comprises N/2 serial stage circuits as opposed to the generator and multiplier 30 of FIG. 1,which has only one serial stage circuit. The generator and multiplier 30F receives the input signal IN. Stage circuits 30F1, 30F2, 30F3 . . . 30FH respectively have reference delay lines 32F1, 32F2, 32F3, . . . , 32FH and scaled replica delay lines 34F1, 34F2, 34F3, . . . , 34FH with respective scaling factors (i.e. such as scaling factors $t_{pd}/2, t_{pd}/4, t_{pd}/8 \ldots t_{pd}/N$). The stage circuits also have respective exclusive OR gates 36F1, 36F2, 36F3, . . . 36FH that each operates as a conversion frequency multiplier circuit for each stage. The final output signal OUT provides a signal with a period of $T_{OUT}$ equal to T/N, which is the frequency multiplied by a factor of N.

Thus, the present invention delayed match generator/multiplier 30, 30A, 30C, 30E, 30F, 31A, or 31B generates a higher frequency clock from a lower frequency clock using scaled delay networks. The generator/multiplier 30, 30A, 30C, 30E, 30F, 31A, or 31B overcomes the problem of the reset period portion of a cycle of a clock signal becoming a larger or smaller percentage of the clock pulse cycle. The generator/multiplier 30, 30A, 30C, 30E, 30F, 31A, or 31B maintains the reset period at a desired set percentage. The maintaining of this desired set percentage is generally achieved by generating a delay which is a function of the period of the clock signal and using the delay to construct a pulse that is able to be used as a reset signal which maintains constant proportion of the clock cycle.

While the invention has been particularly shown and described with reference to a preferred embodiment, it will be understood by those skilled in the art that various changes in form and detail may be made therein without departing from the spirit and scope of the invention.

What is claimed is:

1. A method of multiplying a reference frequency of a periodic digital input signal, comprising the steps of:

propagating the input signal through a reference delay line composed of multiple reference delay stages, propagating the input signal through a replica delay line composed of replica delay stages scaled in proportion to the multiple reference delay stages by a scaled delay factor, extracting a phase shifted signal from the replica delay line based upon the scaled delay factor and a scaled propagation of the input signal through the reference delay line, and logically combining the input signal with the phase shifted signal to generate an output signal that has a frequency that is a frequency multiplication factor of the reference frequency.

2. The method according to claim 1, wherein:

each of the multiple reference delay stages comprises one number of delay elements, each of the multiple replica delay stages comprises another number of delay elements, and the scaled delay factor is the another number of delay elements divided by the one number of delay elements.

3. The method according to claim 1, wherein the extracting step further comprises the steps of:

capturing an on-time period of the input signal, generating a reference phase shifted signal from the reference delay line that is the input signal delayed by a delay time equal to the on-time period, and scaling the delay time of the reference phase shifted signal by the scaled delay factor to generate the phase shifted signal.

4. The method according to claim 3, wherein the capturing step further comprises the steps of:

detecting an occurrence of a low-to-high transition of the input signal, propagating the input signal through a capture signal system when the low-to-high transition occurs, detecting an occurrence of a high-to-low transition of the input signal, and halting propagation of the input signal and holding a captured input signal that is equivalent to the on-time period in the capture signal system when the occurrence of the high-to-low transition has occurred.

5. The method according to claim 3, wherein the scaling step further comprises the steps of:

selecting one of the multiple reference stages that reflects the captured on-time period in the reference delay line, and selecting one of the multiple replica stages that reflects the captured on-time period in the replica delay line in proportion to the scaled delay factor.

6. The method according to claim 5, wherein the extracting step further comprises the steps of:

generating a scaled delay time based on the captured on-time period that is in proportion to the scaled delay factor in the replica delay line, and delaying the input signal by the scaled delay time to provide the phase shifted signal.

7. The method according to claim 1, wherein the logically combining step further comprises the steps of:

performing an exclusive OR operation on the input signal and the phase shifted signal that generates the output signal.

8. A system of multiplying a reference frequency of a periodic digital input signal, comprising:

a reference delay line composed of multiple reference delay stages through which the input signal is propagated, a replica delay line composed of replica delay stages scaled in proportion to the multiple reference delay stages by a scaled delay factor wherein the input signal is propagated, a matched characteristics control system coupled to the reference delay line and the replica delay line for extracting a phase shifted signal from the replica delay line based upon the scaled delay factor and a scaled propagation of the input signal through the reference delay line, and a frequency multiplier converter coupled to the replica delay line for logically combining the input signal with the phase shifted signal to generate an output signal that has a frequency that is a frequency multiplication factor of the reference frequency.

9. The system according to claim 8, wherein:

each of the multiple reference delay stages comprises one number of delay elements, each of the multiple replica delay stages comprises another number of delay elements, and the scaled delay factor is the another number of delay elements divided by the one number of delay elements.

10. The system according to claim 8, wherein the matched characteristics control system extracts the phase shifted signal by capturing an on-time period of the input signal, generating a reference phase shifted signal from the reference delay line that is the input signal delayed by a delay time equal to the on-time period, and scaling the delay time of the reference phase shifted signal by the scaled delay factor to generate the phase shifted signal.

11. The system according to claim 10, wherein the matched characteristics control system further comprises:

a capture and detect system for detecting an occurrence of a low-to-high transition of the input signal and an occurrence of a high-to-low transition of the input signal and through which the input signal is propagated when the low-to-high transition occurs, and a selector coupled to the capture and detect system wherein the selector halts propagation of the input signal and holds a captured input signal that is equivalent to the on-time period in the capture and detect system when the occurrence of the high-to-low transition has occurred.

12. The system according to claim 11, wherein the capture and detect system further comprises:

a transition detector for detecting the occurrence of the low-to-high transition of the input signal and the occurrence of the high-to-low transition of the input signal, and a thermometer register coupled to the transition detector wherein the input signal is propagated through the thermometer register when the low-to-high transition occurs.

13. The system according to claim 10, wherein the capture and detect system further comprises:

a sampler and transition detector for detecting the occurrence of a low-to-high transition of the input signal and the occurrence of the high-to-low transition of the input signal and through which the input signal is propagated when the low-to-high transition occurs.

14. The system according to claim 11, wherein the selector selects one of the multiple reference stages that reflects the captured on-time period in the reference delay line and selects one of the multiple replica stages that reflects the captured on-time period in the replica delay line in proportion to the scaled delay factor.

15. The system according to claim 14, wherein the matched characteristics control system generates a scaled delay time based on the captured on-time period that is in proportion to the scaled delay factor in the replica delay line and delays the input signal by the scaled delay time to provide the phase shifted signal.

16. The system according to claim 8, wherein the frequency multiplier converter further comprises:

an exclusive OR gate to which the input signal and the phase shifted signal are inputted and from which the output signal is generated.

17. A method of phase shifting a periodic digital input signal, comprising the steps of:

propagating the input signal through a reference delay line composed of multiple reference delay stages, propagating the input signal through a replica delay line composed of replica delay stages scaled in proportion to the multiple reference delay stages by a scaled delay factor, and extracting a phase shifted signal from the replica delay line based upon the scaled delay factor and a scaled propagation of the input signal through the reference delay line.

18. The method according to claim 17, wherein the extracting step further comprises the steps of:

capturing an on-time period of the input signal, generating a reference phase shifted signal from the reference delay line that is the input signal delayed by a delay time equal to the on-time period, and scaling the delay time of the reference phase shifted signal by the scaled delay factor to generate the phase shifted signal.

19. The method according to claim 17, further comprising the step of:

using the phase shifted signal to generate a reset signal.

20. A system of multiplying a reference frequency of a periodic digital input signal, comprising:

a reference delay line composed of multiple reference delay stages through which the input signal is propagated, a replica delay line composed of replica delay stages scaled in proportion to the multiple reference delay stages by a scaled delay factor wherein the input signal is propagated, and a matched characteristics control system coupled to the reference delay line and the replica delay line for extracting a phase shifted signal from the replica delay line based upon the scaled delay factor and a scaled propagation of the input signal through the reference delay line.

21. The system according to claim 20, wherein the matched characteristics control system further comprises:

a capture and detect system for detecting an occurrence of a low-to-high transition of the input signal and an occurrence of a high-to-low transition of the input signal and through which the input signal is propagated when the low-to-high transition occurs, and a selector coupled to the capture and detect system wherein the selector halts propagation of the input signal and holds a captured input signal that is equivalent to the on-time period in the capture and detect system when the occurrence of the high-to-low transition has occurred.

22. The system according to claim 20, the phase shifted signal is used to generate a reset signal.

* * * * *